(12) United States Patent  
Cassia et al.

(10) Patent No.: US 8,195,119 B2
(45) Date of Patent: Jun. 5, 2012

(54) SWITCHABLE INPUT PAIR OPERATIONAL AMPLIFIERS

(75) Inventors: Marco Cassia, San Diego, CA (US); Aleksandar M. Tasic, San Diego, CA (US)

(73) Assignee: QUALCOMM, Incorporated, San Diego, CA (US)

( * ) Notice: Subject to any disclaimer, the term of this patent is extended or adjusted under 35 U.S.C. 154(b) by 433 days.

(21) Appl. No.: 12/465,553

(22) Filed: May 13, 2009

(65) Prior Publication Data

US 2010/0289579 A1    Nov. 18, 2010

(51) Int. Cl.
*H04B 1/18* (2006.01)
(52) U.S. Cl. ............ 455/280; 455/552.1; 455/293; 455/341; 330/9; 330/51
(58) Field of Classification Search ............ 455/552.1, 455/293, 341, 343.1; 330/9, 51
See application file for complete search history.

(56) References Cited

U.S. PATENT DOCUMENTS

| 4,628,274 | A | * | 12/1986 | Vittoz et al. ............ 330/9 |
| 7,486,135 | B2 | | 2/2009 | Mu |
| 2004/0246051 | A1 | | 12/2004 | Hsu et al. |

FOREIGN PATENT DOCUMENTS

| EP | 1708361 | 10/2006 |
| EP | 1793493 | 6/2007 |

OTHER PUBLICATIONS

International Search Report and Written Opinion—PCT/US2010/034784, International Search Authority—European Patent Office—Jul. 6, 2010.

* cited by examiner

*Primary Examiner* — Lincoln Donovan
*Assistant Examiner* — Shikha Goyal
(74) *Attorney, Agent, or Firm* — Ramin Mobarhan (57) ABSTRACT

Techniques for designing a switchable amplifier are described. In one aspect, a switchable amplifier including a core amplifier circuit configured to selectively enable one or more parallel input transistor pairs is described. The core amplifier circuit comprises a permanently enabled input transistor pair. In another aspect, a device operable between a first mode of operation and a second mode of operation comprising a receiver logic circuit for selectably enabling and disabling a plurality of input transistor pairs within a switchable amplifier is described where the switchable amplifier also includes a core amplifier circuit coupled to the receiver logic circuit for selectably enabling and disabling a transistor pair therein. The described switchable amplifiers result in the ability to provide varying amplifier performance characteristics based upon the current mode of operation of the device.

14 Claims, 9 Drawing Sheets

SWITCHABLE INPUT PAIR OPERATIONAL AMPLIFIERS

TECHNICAL FIELD

The present disclosure relates generally to electronics, and more specifically to switchable input pair operational amplifiers.

BACKGROUND

In communication devices designed to operate in different modes, such as multi-band capable cellular devices, multiple amplifiers are typically used corresponding to each mode of operation. Each amplifier may, for example, amplify receive signals corresponding to an associated cellular technology, such as Global System for Mobile Communication (GSM), Code Division Multiple Access (CDMA), Long Term Evolution (LTE), Worldwide Interoperability for Microwave Access (WiMax), Wireless Local Area Network (WLAN) and Bluetooth or other Personal Area Networks (PAN). This is because each amplifier must be designed to maximize associated performance characteristics, such as very low 1/f noise, increased bandwidth, or ability to operate at higher frequencies, for the corresponding cellular technology.

Figure 1:
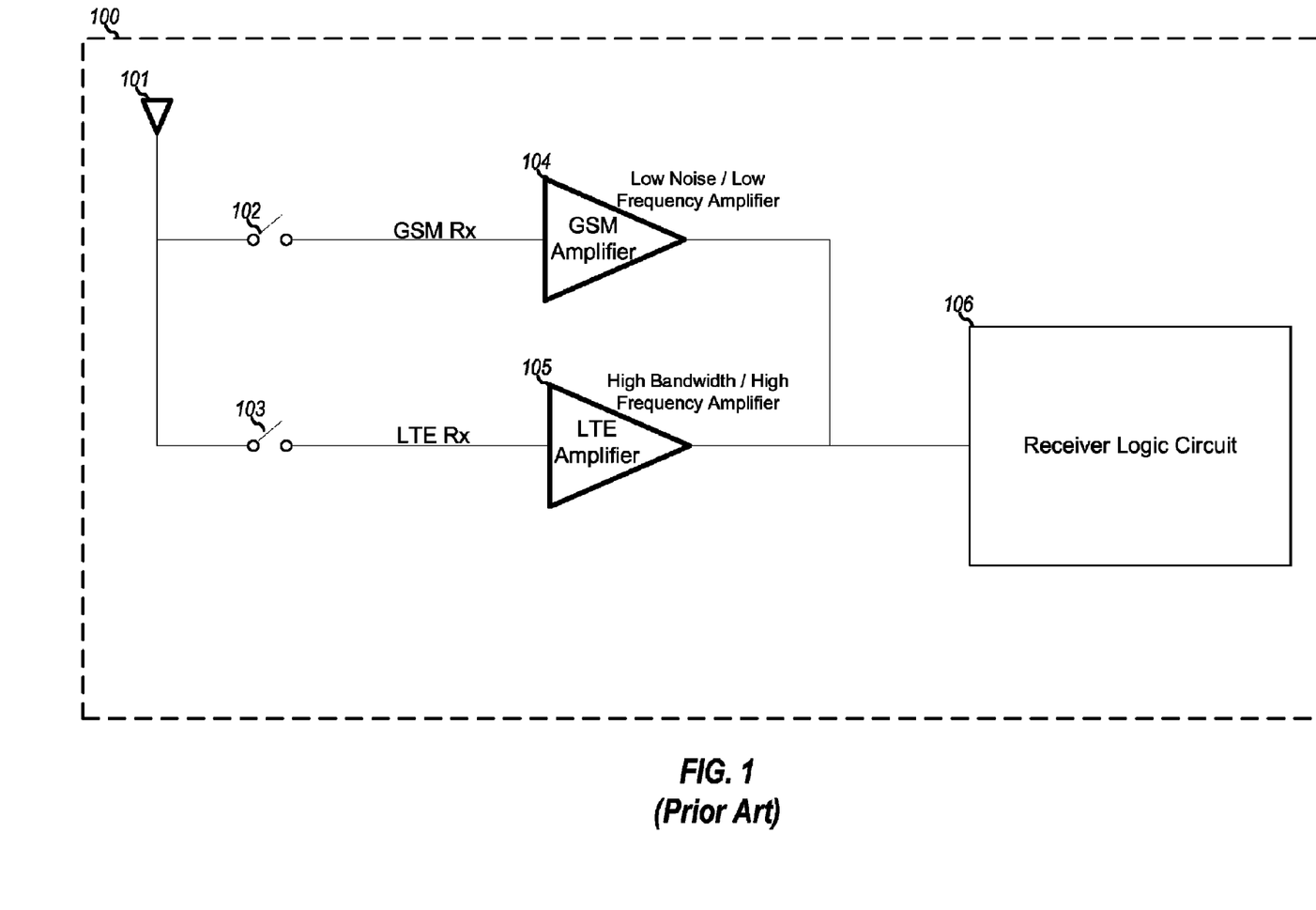
FIG. 1 is a high level block diagram of a conventional device 100 with plural amplifiers 104 and 105, each for amplifying the desired incoming signal when operating in multi-mode.

FIG. 1 is a high level block diagram of a conventional device 100 with plural amplifiers 104 and 105, each for amplifying the desired incoming signal when operating in multi-mode. In the particular example, device 100 is capable of processing receive signals for both GSM and LTE cellular technologies. The electromagnetic waves containing the received signals are absorbed by antenna 101 and selectably routed by receiver logic 106 to amplifier 104 (associated with the GSM mode of operation) or to amplifier 105 (associated with the LTE mode of operation) by appropriately enabling and disabling controls switches 102 and 103. When operating in GSM mode, switch 102 is closed and switch 103 is open, thus allowing the received signal to flow to GSM amplifier 104 and preventing the received signal from flowing to LTE amplifier 105. Amplifier 104 is configured to provide low noise performance to meet the low noise requirements of the GSM cellular technology. Amplifier 104 may achieve this low noise performance by utilizing a large input transistor pair. Larger transistors exhibit less 1/f noise because larger transistors have larger gate capacitances, which smoothes the fluctuations in channel charge. Thus, the larger the transistor the lower the resulting 1/f noise. The mean-square 1/f drain noise current can be expressed as follows:

$$\overline{i^2} = (K/f)(g_m^2/WLC_{ox}^2) \times BW \qquad \text{Eq. (1)}$$

where, W is the gate width, L is the gate length, Cox is the transistor gate capacitance, gm is the transistor transconductance, f is the operating frequency, K is an empirical constant and BW is the noise bandwidth of the transistor. Thus, an increase in transistor gate area results in a decrease in transistor 1/f noise.

When operating in LTE mode, switch 103 is closed and switch 102 is open, thus allowing the received signal to flow to amplifier 105 and preventing the received signal from flowing to GSM amplifier 104. The LTE amplifier 105 is configured to provide high frequency performance to meet the frequency requirements of the LTE cellular technology. LTE amplifier 105 may achieve this high frequency performance by utilizing a small input transistor pair. Smaller transistors exhibit higher operating frequencies because smaller transistors have smaller gate capacitances, which reduce the time necessary to charge and discharge the transistor. Transistor unity gain frequency can be expressed as follows:

$$W_T = g_m/(C_{gs}+C_{gd}) \qquad \text{Eq. (2)}$$

where, $g_m$ is the transconductance of the transistor, $C_{gs}$ is the gate-to-source capacitance and the $C_{gd}$ is the gate-to-drain capacitance.

Figure 2:
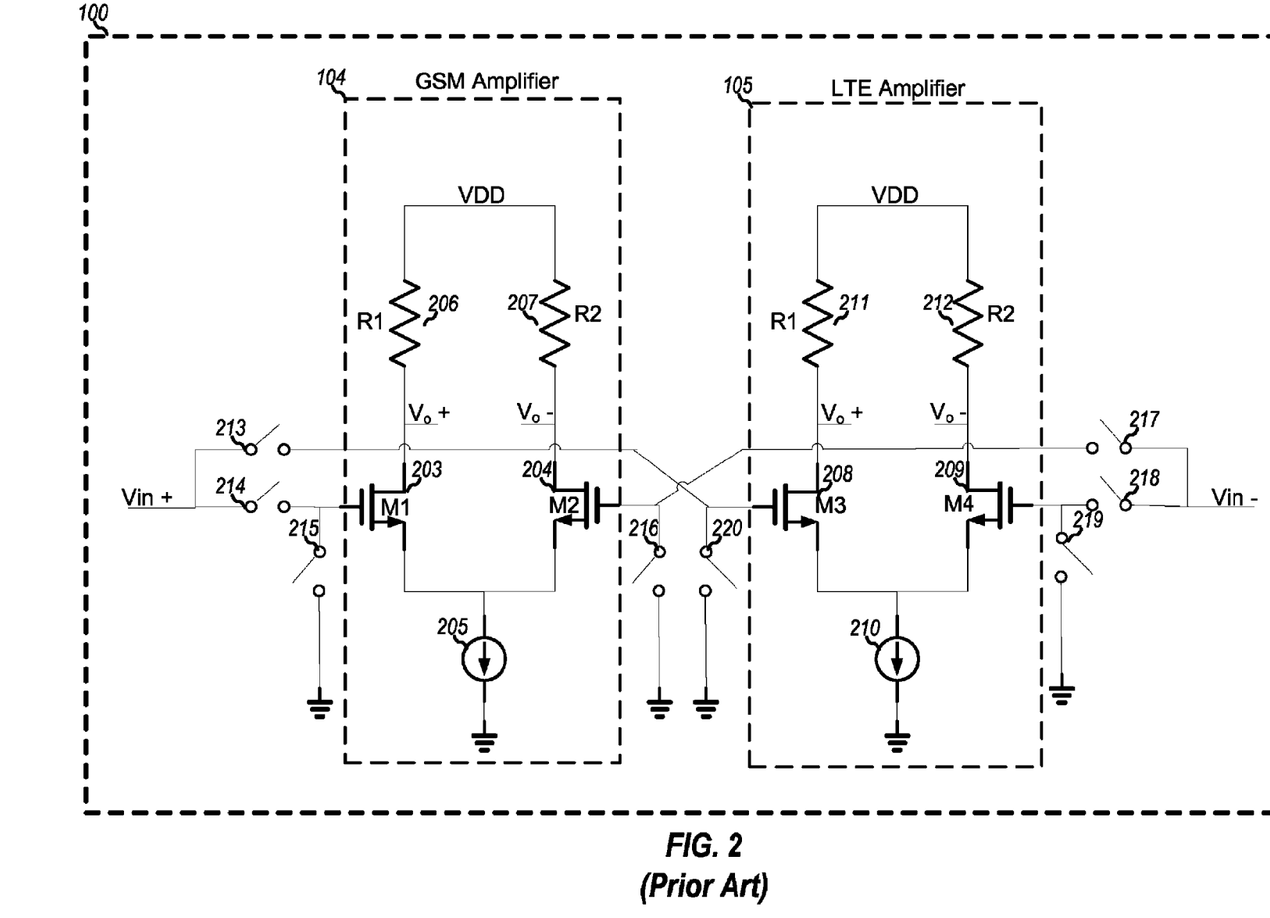
FIG. 2 is a low level circuit diagram of the device shown in FIG. 1.

FIG. 2 is a low level circuit diagram of the device shown in FIG. 1. Amplifier 104 is comprised of large transistors 203 and 204 coupled in a common source configuration to current source 205. The drain of large transistor 203 is coupled to a first terminal of resistor 206. The drain of large transistor 204 is coupled to a first transistor of resistor 207. Resistors 206, 207 serve as active loads. A second terminal of resistor 206 and resistor 207 is coupled to power supply VDD.

LTE amplifier 105 comprises small transistors 208 and 209 coupled in a common source configuration to current source 210. The drain of small transistor 208 is coupled to a first terminal of resistor 211. The drain of small transistor 209 is coupled to a first terminal of resistor 212. A second terminal of resistor 211 and 212 is coupled to power supply VDD.

According to the required performance characteristics described above, device 100 is capable of selecting the desired amplifier by enabling and disabling selected ones of switches 213-220. When for example operating in GSM mode, switches 214, 216, 219 and 220 are closed and switches 213, 215, 216 and 218 are opened. This switching configuration grounds the gate terminals of transistors 208 and 209 of amplifier 105 and diverts the input signal Vin + and Vin − to the gate terminals of transistors 203 and 204 of amplifier 104; thus enabling GSM mode operation and preventing amplifier 105 from becoming operational.

By contrast, when operating in LTE mode, switches 214, 216, 219 and 220 are opened and switches 213, 215, 216 and 218 are closed. This switching configuration grounds the gate terminals of transistors 203 and 204 of amplifier 104 and diverts the input signal Vin + and Vin − to the gate terminals of transistors 208 and 209 of amplifier 105; thus enabling LTE mode of operation and preventing amplifier 104 from becoming operational.

Thus, conventional devices use plural amplifiers to achieve desired performance characteristics for each mode of operation by utilizing a separate amplifier circuit for each mode of operation.

DETAILED DESCRIPTION

The word "exemplary" is used herein to mean "serving as an example, instance, or illustration." Any embodiment described herein as "exemplary" is not necessarily to be construed as preferred or advantageous over other embodiments.

The detailed description set forth below in connection with the appended drawings is intended as a description of exemplary embodiments of the present invention and is not intended to represent the only embodiments in which the present invention can be practiced. The term "exemplary" used throughout this description means "serving as an example, instance, or illustration," and should not necessarily be construed as preferred or advantageous over other exemplary embodiments. The detailed description includes specific details for the purpose of providing a thorough understanding of the exemplary embodiments of the invention. It will be apparent to those skilled in the art that the exemplary embodiments of the invention may be practiced without these specific details. In some instances, well known structures and devices are shown in block diagram form in order to avoid obscuring the novelty of the exemplary embodiments presented herein.

Figure 3:
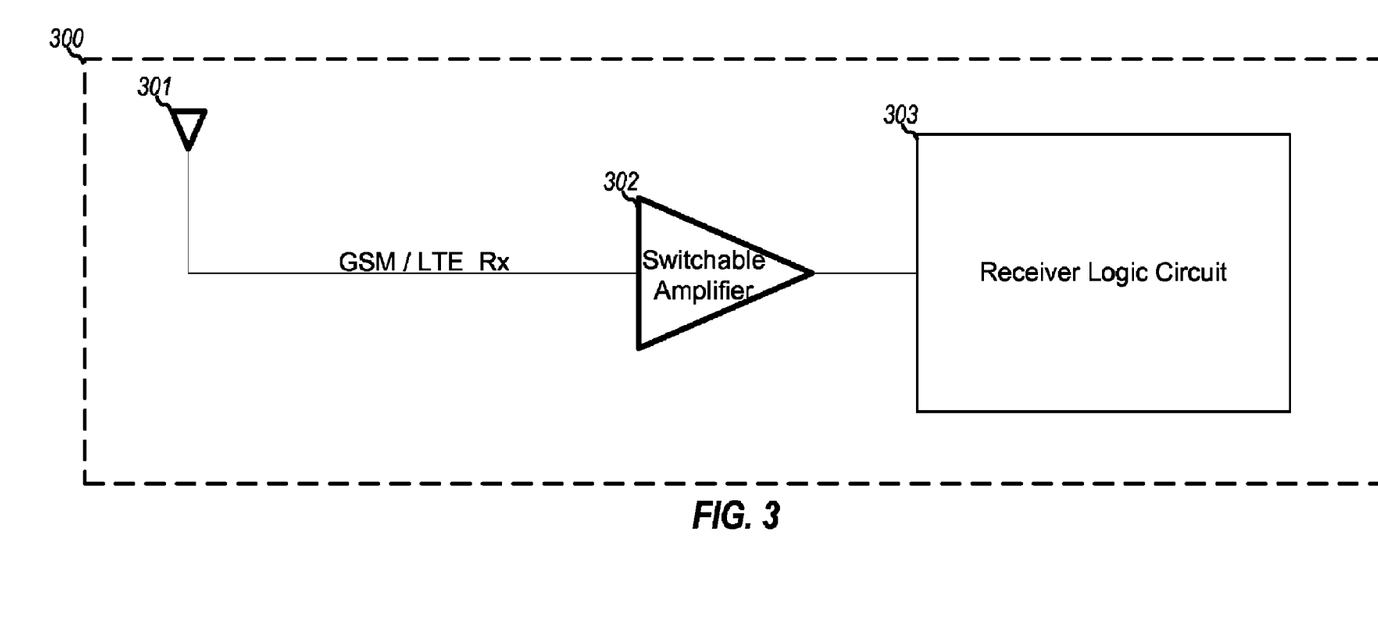
FIG. 3 shows a high level block diagram of a multi-mode device utilizing a single switchable amplifier for each mode of operation in accordance with an exemplary embodiment.

FIG. 3 shows a high level block diagram of a multi-mode device 300 utilizing a single switchable amplifier 302 for each mode of operation in accordance with an exemplary embodiment. Multi-mode device 300 includes antenna 301, which receives a transmitted signal that is coupled to the input terminal of switchable amplifier 302. The output of switchable amplifier 302 is coupled to receiver logic circuit 303.

Figure 4:
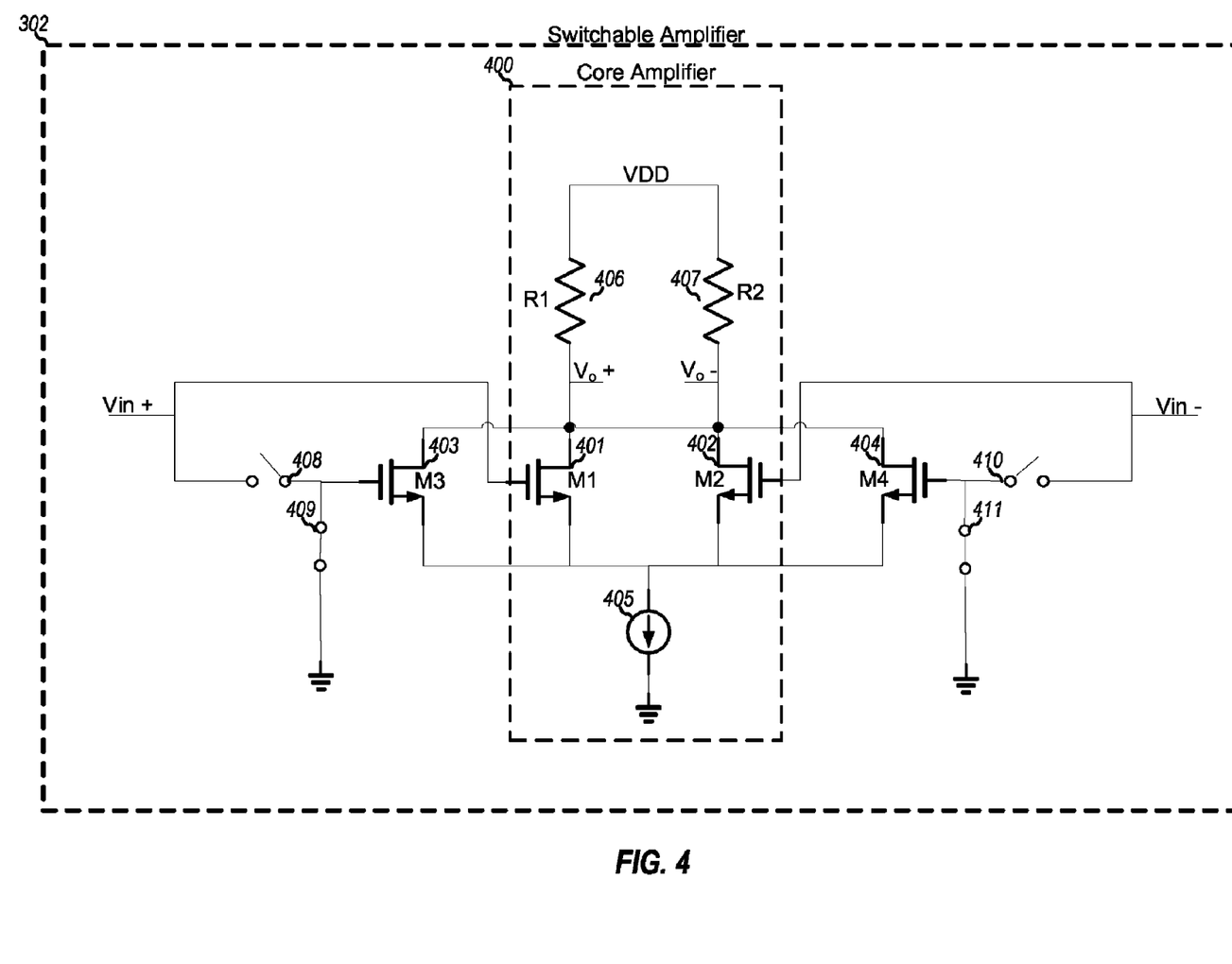
FIG. 4 is a low level circuit diagram of the switchable amplifier shown in FIG. 3 having a first switching configuration in accordance with a first exemplary embodiment.

FIG. 4 is a low level circuit diagram of the switchable amplifier 302 shown in FIG. 3 having a first switching configuration in accordance with a first exemplary embodiment.

Figure 5:
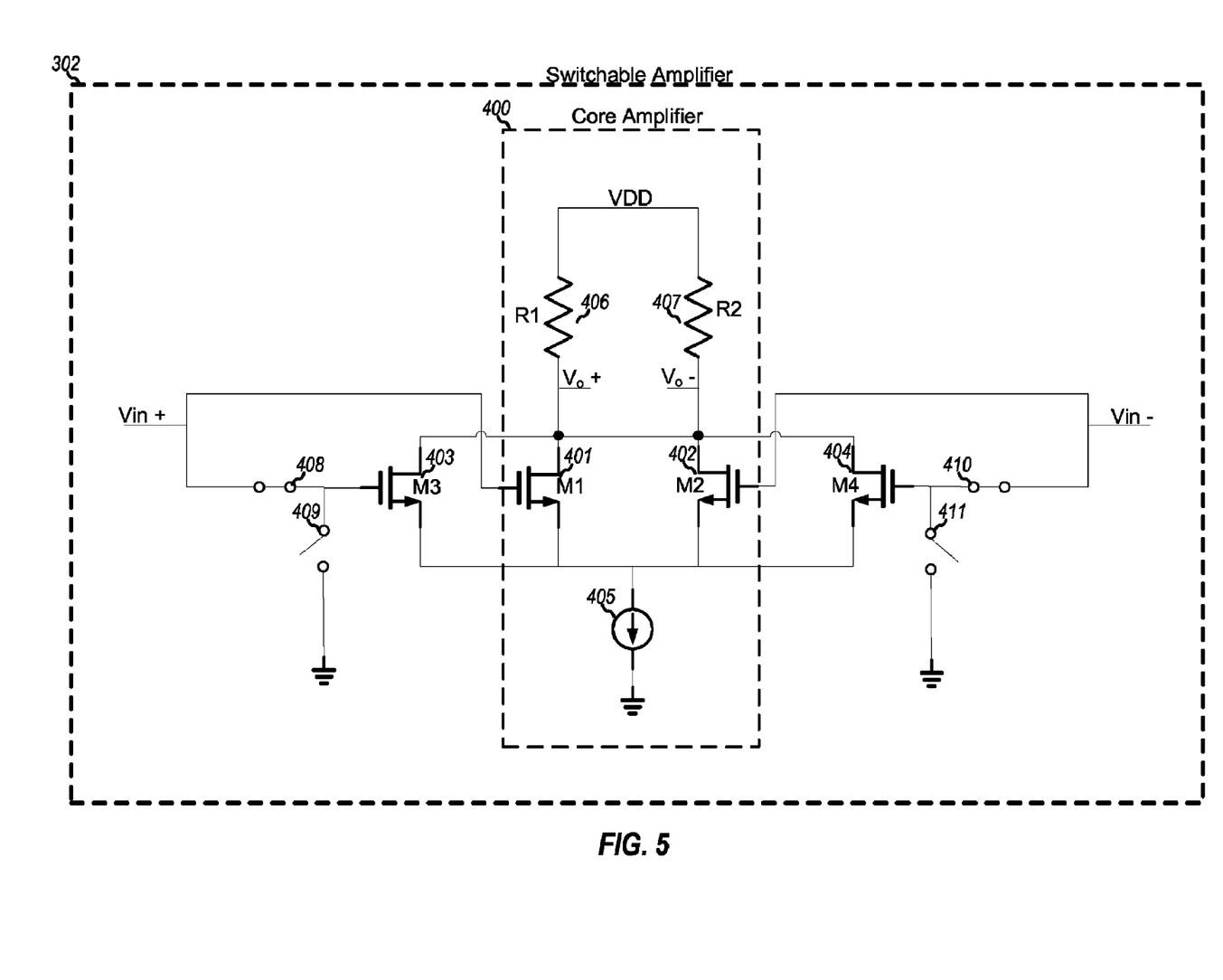
FIG. 5 is a low level circuit diagram of switchable amplifier shown in FIG. 3 in a second switching configuration in accordance with the first exemplary embodiment.

FIG. 5 is a low level circuit diagram of switchable amplifier 302 shown in FIG. 3 in a second switching configuration in accordance with the first exemplary embodiment.

Referring to FIG. 4, switchable amplifier 302 is shown comprised of core amplifier circuit 400, a secondary pair of input transistors 403 and 404 and control switches 408-411 arranged in a first switching configuration. Core amplifier circuit 400 comprises small transistors 401 and 402 coupled in a common source configuration to current source 405. The drain of small transistor 401 is coupled to a first terminal of resistor 406. The drain of small transistor 402 is coupled to a first transistor of resistor 407. A second terminal of resistor 406 and resistor 407 is coupled to power supply VDD.

Small transistors 401 and 402 are always enabled in the circuit configuration shown in FIG. 4. However, switches 408-411 control whether large transistors 403 and 404 are enabled. If small input transistor pair performance is desired, switches 408 and 410 are opened while switches 409 and 411 are closed, as is shown in FIG. 4 and described in the flow chart shown in FIG. 8. In this first switching configuration, the gate of large transistors 403 and 404 are isolated from input signals Vin + and Vin –, respectively, and coupled to ground; thus disabling large input pair transistors 403 and 404 within core amplifier circuit 400. The disabling of large input pair transistors 403 and 404 maximizes the bandwidth of core amplifier circuit 400 because the effective input transistor pair capacitances remain equal to the minimal capacitance values of small input pair transistors 401 and 402.

This small input transistor pair performance configuration may be desirable for cellular technologies, such as LTE cellular technology, which require high amplifier bandwidth.

While the exemplary embodiment depicted in FIG. 4 shows only one switchable parallel input transistor pair, one skilled in the art would readily appreciate and understand that multiple switchable parallel input transistor pairs may be utilized to further enhance or achieve even better performance characteristics by switchable amplifier 302.

FIG. 5 shows switchable amplifier 302 in a second switching configuration. Here, control switches 408-411 are configured to enable the large input transistor pair 403, 404.

Small transistors 401 and 402 are always enabled (i.e., permanently enabled) in the circuit configuration shown in FIG. 5. However, switches 408-411 control whether large transistors 403 and 404 are enabled. If large input transistor pair performance is desired, switches 408 and 410 are closed and switches 409 and 411 are opened, as is shown in FIG. 5 and described in the flow chart shown in FIG. 8. In this second switching configuration, the gates of transistor 403 and 404 are coupled to input signals Vin+ and Vin–, respectively, and isolated from ground; thus enabling large input pair transistors 403 and 404. When large transistors 403 and 404 are enabled the result is a parallel combination of transistors 401 and 403, as well as a parallel combination of transistors 402 and 403. That is, the gate, drain and source of transistors 401 and 403 are coupled together. Likewise, the gate, drain and source of transistors 402 and 404 are coupled together. This results in an effective input transistor pair, where each input transistor has an effective channel area equal to the sum of the channel area of each transistor coupled in parallel. The effective channel area of the resulting effective input transistor can be expressed as follows:

$$A_{effective} = A_{401} + A_{403} = A_{402} + A_{404} \qquad \text{Eq. (3)}$$

where, $A_{401}$ is the channel area of transistor 401, $A_{403}$ is the channel area of transistor 403, $A_{402}$ is the channel area of transistor 402 and $A_{404}$ is the channel area of transistor 404.

In this way, the gate to source capacitance, as well as the gate to drain capacitance also sums together to create an effective capacitance equal to the sum of capacitance in each parallel transistor. The effective gate to source capacitance may be expressed as follows:

$$C_{gs\_effective} = C_{gs\_401} + C_{gs\_403} = C_{gs\_402} + C_{gs\_404} \qquad \text{Eq. (4)}$$

where, $C_{gs\_401}$ is the gate to source capacitance of transistor 401, $C_{gs\_403}$ is the gate to source capacitance of transistor 403, $C_{gs\_402}$ is the gate to source capacitance of transistor 403 and $C_{gs\_404}$ is the gate to source capacitance of transistor 404.

The effective gate to drain capacitance may be expressed as follows:

$$C_{gd\_effective} = C_{gd\_401} + C_{gd\_403} = C_{gd\_402} + C_{gd\_404} \qquad \text{Eq. (5)}$$

where, $C_{gd\_401}$ is the gate to drain capacitance of transistor 401, $C_{gd\_403}$ is the gate to drain capacitance of transistor 403, $C_{gd\_402}$ is the gate to drain capacitance of transistor 403 and $C_{gd\_404}$ is the gate to drain capacitance of transistor 404.

Thus, this large input transistor pair configuration results in an effective transistor pair with a larger channel area and increased transistor capacitance. This results in a decrease of 1/f noise because 1/f noise decreases as transistor channel area increases, as is expressed in Equation 1 above. However, this also results in a decrease in transistor bandwidth because transistor bandwidth decreases as transistor capacitance increases, as is expressed in Equation 2 above.

Therefore, this large input transistor pair configuration may be desirable for cellular technologies, such as GSM cellular technology, which require low 1/f noise and reduced amplifier bandwidth.

Figure 6:
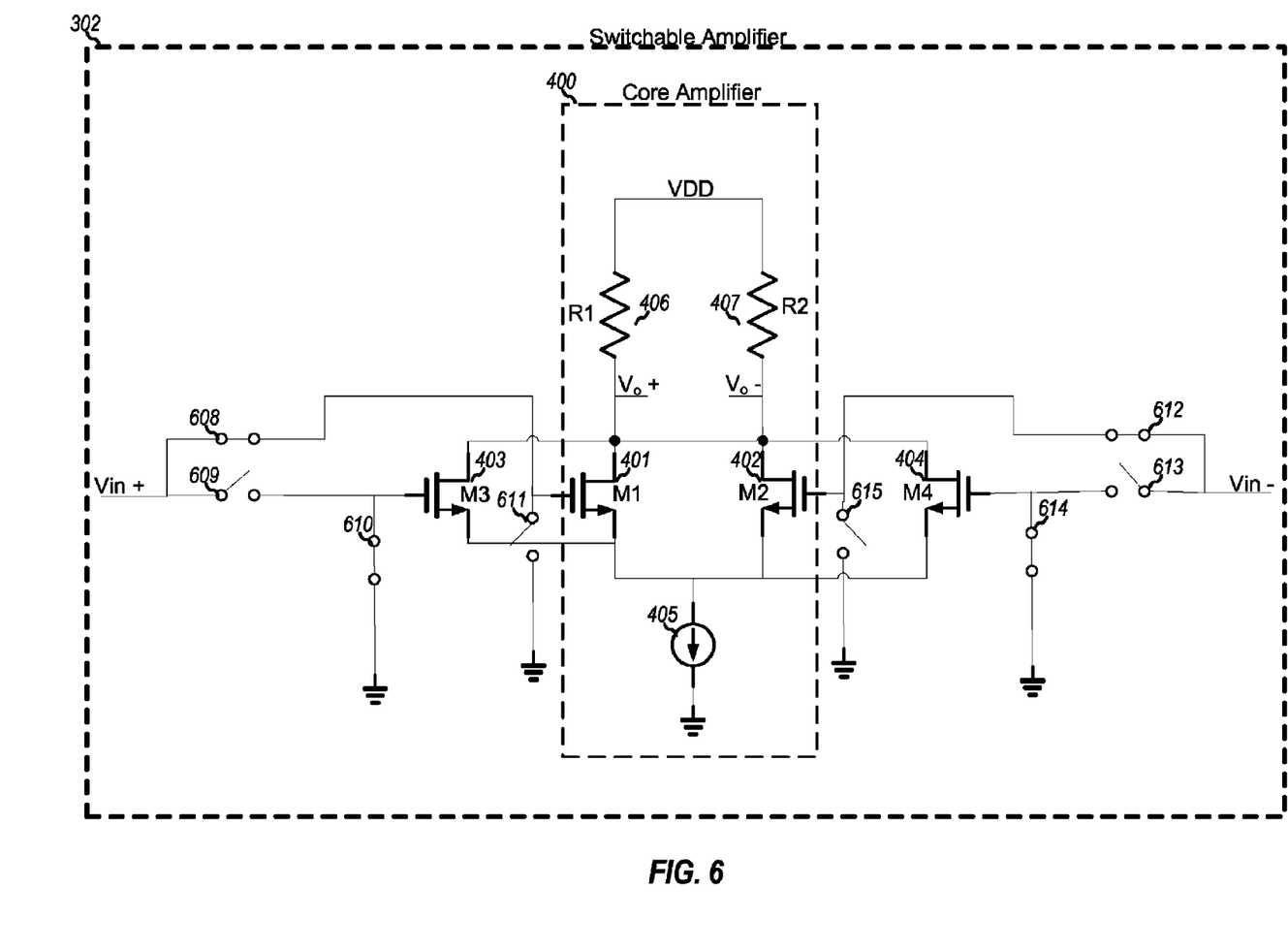
FIG. 6 is a low level circuit diagram of the switchable amplifier shown in FIG. 3 having a third switching configuration in accordance with a second exemplary embodiment.

FIG. 6 is a low level circuit diagram of a switchable amplifier 302 shown in FIG. 3 having a third switching configuration in accordance with a second exemplary embodiment.

Figure 7:
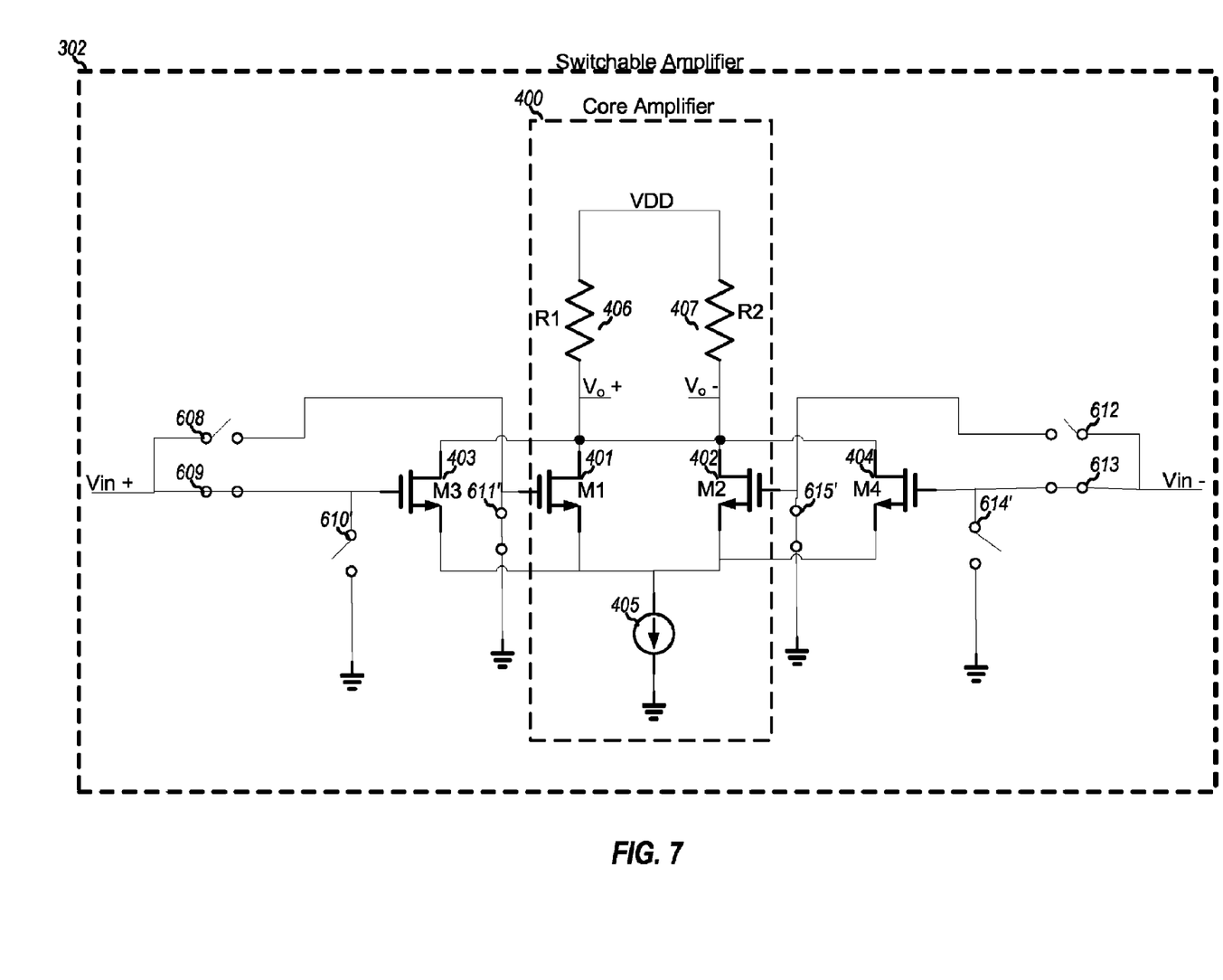
FIG. 7 is a low level circuit diagram of switchable amplifier shown in FIG. 3 in a fourth switching configuration in accordance with the second exemplary embodiment.

FIG. 7 is a low level circuit diagram of switchable amplifier 302 shown in FIG. 3 in a fourth switching configuration in accordance with the second exemplary embodiment.

Referring now to the second embodiment of FIG. 6 and FIG. 7, switchable amplifier 302 is shown with two switchable parallel input transistor pairs. The first input transistor pair is comprised of small transistors 401 and 402. The second input transistor pair is comprised of large transistors 403 and 404, as in FIGS. 4 and 5, except the switching configurations are different and are comprised of control switches 608-615. In a third switching configuration shown in FIG. 6, control switches 608-615 are configured to disable the large input transistors 403 and 404 and enable the small input transistors 401 and 402. Core amplifier circuit 400 is the same as in FIGS. 4 and 5 and includes the small transistors 401 and 402 which are coupled in a common source configuration to current source 405. Specifically, the drain of small transistor 401 is coupled to the first terminal of resistor 406 and the drain of small transistor 402 is coupled to the first transistor of resistor 407. The second terminal of resistor 406 and resistor 407 are coupled to power supply VDD.

In this third switching configuration, the small input transistor pair 401 and 402 is NOT always enabled. Rather, switches 608-615 control whether large transistors 403 and 404 OR small transistors 401 and 402 are enabled. When small input transistor pair performance is desired, switches 609, 611, 613 and 615 are opened and switches 608, 610, 612 and 614 are closed, as is shown in FIG. 6 and described in the flow chart shown in FIG. 9. In this third switching configuration, the gates of large transistor pair 403 and 404 are isolated from input signals Vin + and Vin −, respectively, and coupled to ground, thus disabling the large input pair transistors 403 and 404 within the switchable amplifier 400. Meanwhile, the small transistors 401 and 402 are coupled to input signals Vin+ and Vin−, respectively, thus enabling the small input transistor pair 401 and 402. The disabling of the large input transistor pair 403 and 404 and enabling of small input transistor pair 401 and 402 maximizes the bandwidth of switchable amplifier 400 because the small input pair transistors 401 and 402 have smaller gate to drain and gate to source capacitances than the large input pair transistors 403 and 404. The inverse relationship between transistor capacitance and transistor bandwidth is described above in Equation 2.

This small input transistor pair performance configuration may be desirable for cellular technologies, such as LTE cellular technology, which require high amplifier bandwidth.

In the fourth switching configuration shown in FIG. 7 in connection with the second embodiment shown, control switches 608-615 are configured to enable the large input transistor pair 403 and 404 and disable the small input transistor pair 401 and 402. Here again, core amplifier circuit 400 is the same as in FIGS. 4, 5, and 6 and includes the small transistors 401 and 402 which are coupled in a common source configuration to current source 405. Specifically, the drain of small transistor 401 is coupled to the first terminal of resistor 406 and the drain of small transistor 402 is coupled to the first transistor of resistor 407. The second terminal of resistor 406 and resistor 407 are coupled to power supply VDD.

In this fourth switching configuration, the small input transistor pair 401 and 402 is NOT always enabled. Rather, switches 608-615 control whether large transistors 403 and 404 OR small transistors 401 and 402 are enabled. When large input transistor pair performance is desired, switches 609, 611, 613 and 615 are closed and switches 608, 610, 612 and 614 are opened, as is shown in FIG. 7 and described in the flow chart shown in FIG. 9. In this fourth switching configuration, the gates of small transistor pair 401 and 402 are isolated from input signals Vin + and Vin −, respectively, and coupled to ground, thus disabling the small input pair transistors 401 and 402 within the switchable amplifier 400. Meanwhile, the large transistors 403 and 404 are coupled to input signals Vin+ and Vin−, respectively, thus enabling the large input transistor pair 403 and 404. The disabling of the small input pair transistors 401 and 402 and enabling of large input transistor pair 403 and 404 minimizes the 1/f noise while sacrificing transistor bandwidth. 1/f noise is reduced because large input pair transistors 403 and 404 have a greater channel area, which is inversely proportional to 1/f noise, as is described in Equation 1 above. Transistor bandwidth is reduced because large input pair transistors 403 and 404 have greater gate to source and gate to drain capacitance, which is inversely related to transistor bandwidth, as is described in Equations 2 above.

This large input transistor pair performance configuration may be desirable for cellular technologies, such as GSM cellular technology, which requires reduced 1/f noise and reduced amplifier bandwidth.

Figure 8:
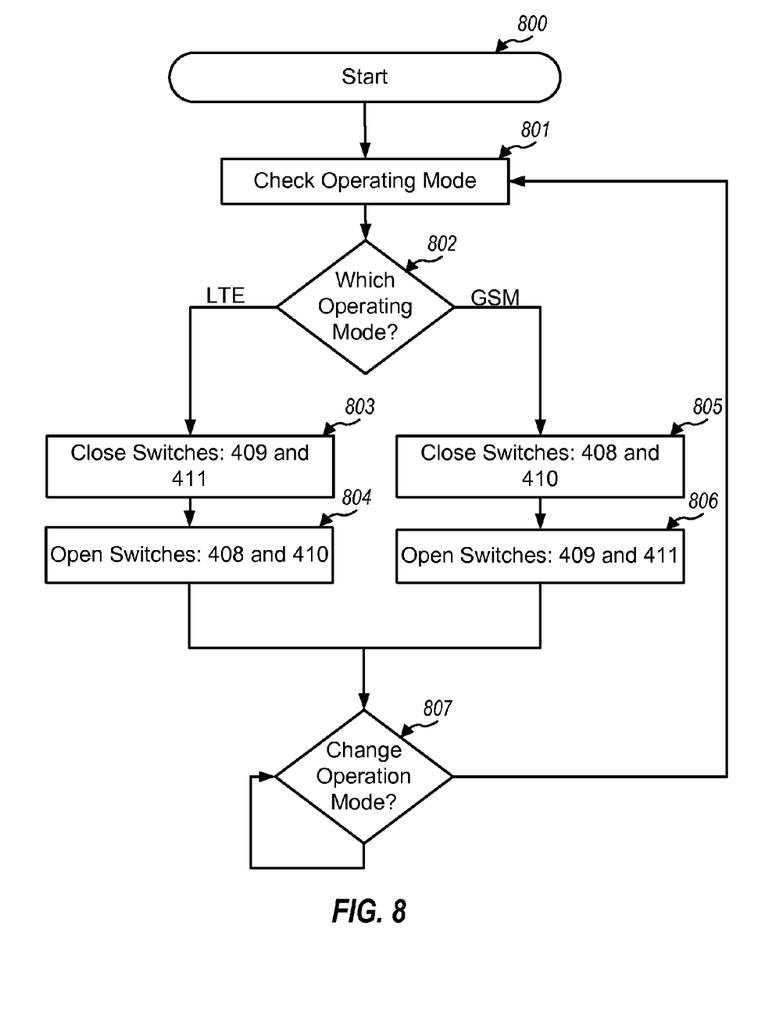
FIG. 8 is a flow chart showing the operational flow of the receiver logic circuit which is used to switch between the first and second switching configurations shown in FIG. 4 and FIG. 5.

FIG. 8 is a flow chart showing the operational flow of the receiver logic circuit, which is used to switch between the first and second switching configurations shown in FIG. 4 and FIG. 5.

The operational flow starts at step 800 when the device is turned on. In step 801 the receiver logic checks what mode of operation the device is currently engaged. Once the mode of operation of the device has been determined the receiver logic selects the switch configuration that will be executed for the determined mode of operation. In the exemplary embodiment shown in FIG. 4 and FIG. 5 the receiver logic is capable of operating in GSM and LTE modes of operation. If the device is operating in LTE mode, then the "LTE" output of step 801 is followed to step 803. In step 803 switches 409 and 411 are closed. In step 804 switches 408 and 410 are opened. Once the switches are appropriately configured for LTE mode operation the device monitors for a change in operating mode in step 807.

This LTE switch configuration disables large transistors 403 and 404 resulting in only input transistor pair 401 and 402 being enabled. As described above, the small input transistor pair 401 and 402 may provide improved performance such as increased bandwidth due to reduced transistor capacitances.

If a change in operating mode is detected, then the device checks which operating mode in step 801. Once the mode of operation of the device has been determined, the receiver logic selects the switch configuration that will be executed for the determined mode of operation in step 802. If the device is operating in GSM mode, then the "GSM" output of step 801 is followed to step 805. In step 805 switches 408 and 410 are closed. In step 806 switches 409 and 411 are opened. Once the switches are appropriately configured for GSM mode operation the device monitors for a change in operating mode in step 807. The GSM switch configuration enables large transistors 403 and 404. Therefore, resulting in large input transistors 403 and 404 being enabled as well as small input transistors 401 and 402. As described above, the large input transistor pair 403 and 404 enabled in parallel with small input transistor 401 and 402 may provide improved performance such as reduced 1/f noise due to the increased effective channel area of the transistor combination.

Figure 9:
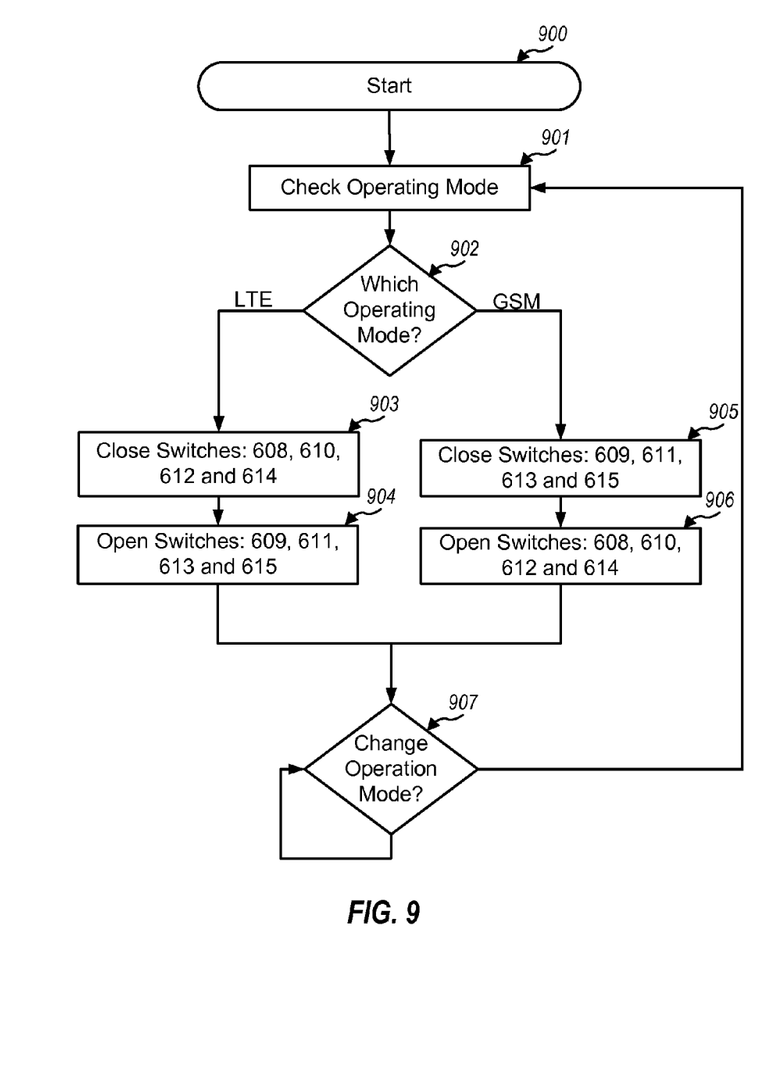
FIG. 9 is a flow chart showing the operational flow of the receiver logic circuit which is used to switch between the third and fourth switching configurations shown in FIG. 6 and FIG. 7.

FIG. 9 is a flow chart showing the operational flow of the receiver logic circuit, which is used to switch between the third and fourth switching configurations shown in FIG. 6 and FIG. 7.

The operational flow starts at step 900 when the device is turned on. In step 901 the receiver logic checks what mode of operation the device is currently engaged. Once the mode of operation of the device has been determined the receiver logic selects the switch configuration that will be executed for the determined mode of operation. In the exemplary embodiment shown in FIG. 6 and FIG. 7 the receiver logic is capable of operating in GSM and LTE modes of operation. If the device is operating in LTE mode, then the "LTE" output of step 901 is followed to step 903. In step 903 switches 608, 610, 612 and 614 are closed. In step 904 switches 609, 611, 613 and 615 are opened.

This LTE switch configuration enables small transistors 401 and 402 while disabling large transistors 403 and 404. As described above, the small input transistor pair 401 and 402 may provide improved performance such as increased bandwidth due to reduced transistor capacitances.

Once the switches are appropriately configured for LTE mode operation the device monitors for a change in operating mode in step 907. If a change in operating mode is detected, then the device checks which operating mode in step 901. Once the mode of operation of the device has been determined, the receiver logic selects the switch configuration that will be executed for the determined mode of operation in step 902. If the device is operating in GSM mode, then the "GSM" output of step 901 is followed to step 905. In step 905 switches 609, 611, 613 and 615 are closed. In step 906 switches 608, 610, 612 and 614 are opened. The GSM switch configuration enables large transistors 403 and 404 while disabling small transistors 401 and 402. As described above, the large input transistor pair 403 and 404 may provide improved performance such as reduced 1/f noise due to the increased channel area of the larger transistors. Once the switches are appropriately configured for LTE mode operation the device monitors for a change in operating mode in step 907.

The exemplary embodiments of a single switchable amplifier described above may be utilized to provide the variety of performance characteristics required by cellular technologies without the need for multiple amplifier circuits. Thus, reducing device area and cost while still satisfying the performance requirements for each cellular technology.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the exemplary embodiments of the invention.

The various illustrative logical blocks, modules, and circuits described in connection with the embodiments disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the embodiments disclosed herein may be embodied directly in hardware, in a software module executed by a processor, or in a combination of the two. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosed exemplary embodiments is provided to enable any person skilled in the art to make or use the present invention. Various modifications to these exemplary embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. A switchable amplifier for use in a multi-mode device operable between a first low frequency mode of operation and a second high frequency mode of operation, the switchable amplifier comprising:
   a parallel input transistor pair;
   a core amplifier circuit, the core amplifier circuit having an input transistor pair that is permanently enabled during operation in the first low frequency and second high frequency modes of operation; and
   a plurality of switches coupled to the parallel input transistor pair and to the input transistor pair and configured to selectively turn on and off to set the switchable amplifier:
   (i) in a large input transistor pair configuration when the multi-mode device is operating in the first low frequency mode of operation, which mode is characterized by low amplifier bandwidth, and
   (ii) in a small transistor pair configuration when operating in the second high frequency mode of operation, which mode is characterized by high amplifier bandwidth.

2. The switchable amplifier of claim 1, wherein a channel area of the transistors in the parallel input transistor pair and a channel area of the transistors in the input transistor pair is sized such than when switched on and off by the switches, the switchable amplifier is set to a desired one of the large input transistor pair and small input transistor pair configurations.

3. The switchable amplifier of claim 2, wherein the channel area of the transistors in the parallel input transistor pair is smaller than the channel area of the transistors in the input transistor pair.

4. The switchable amplifier of claim 2, wherein the channel area of the transistors in the parallel input transistor pair is larger than the channel area of the transistors in the input transistor pair.

5. The switchable amplifier of claim 2, wherein the channel area of the transistors in the parallel input transistor pair is the same size as the channel area of the transistors in the input transistor pair.

6. The switchable device of claim 1, wherein the multi-mode device is a wireless communication device.

7. The switchable device of claim 6, wherein the wireless communication device is a multi-mode device operable in at least a first cellular technology band and a second cellular technology band, the switchable amplifier being switched to operate in the small transistor pair configuration when in the first cellular technology band, and in the large transistor pair configuration when in the second cellular technology band.

8. A method of setting switches in a switchable amplifier having a parallel input transistor pair and a core amplifier circuit, where the core amplifier circuit includes an input transistor pair that is permanently enabled during operation in a first low frequency mode of operation and in a second high frequency modes of operation, the method comprising:
   selectably turning on and off the switches so as to set the switchable amplifier:
   (i) in a large input transistor pair configuration when the multi-mode device is operating in the first low frequency mode of operation, which mode is characterized by low amplifier bandwidth, and
   (ii) in a small transistor pair configuration when operating in the second high frequency mode of operation, which mode is characterized by high amplifier bandwidth.

9. The method of claim 8, wherein a channel area of the transistors in the parallel input transistor pair and a channel area of the transistors in the input transistor pair is sized such than when switched on and off by the switches, the switchable amplifier is set to a desired one of the large input transistor pair and small input transistor pair configurations.

10. The method of claim 9, wherein the channel area of the transistors in the parallel input transistor pair is smaller than the channel area of the transistors in the input transistor pair.

11. The method of claim 9, wherein the channel area of the transistors in the parallel input transistor pair is larger than the channel area of the transistors in the input transistor pair.

12. The method of claim 9, wherein the channel area of the transistors in the parallel input transistor pair is the same size as the channel area of the transistors in the input transistor pair.

13. The method of claim 8, wherein the switchable amplifier is configured for use in a wireless communication device.

14. The switchable device of claim 6, wherein the wireless communication device is a multi-mode device operable in at least a first cellular technology band and a second cellular technology band, the switchable amplifier being switched to operate in the small transistor pair configuration when in the first cellular technology band, and in the large transistor pair configuration when in the second cellular technology band.

* * * * *